US007279224B2

United States Patent
Aoki et al.

(10) Patent No.: US 7,279,224 B2
(45) Date of Patent: Oct. 9, 2007

(54) HEAT CONDUCTIVE COMPOSITE SHEET AND PROCESS FOR PRODUCING SAME

(75) Inventors: Yoshitaka Aoki, Takasaki (JP); Tsutomu Yoneyama, Annaka (JP); Kunihiko Mita, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/643,978

(22) Filed: Aug. 20, 2003

(65) Prior Publication Data
US 2004/0043229 A1 Mar. 4, 2004

(30) Foreign Application Priority Data
Sep. 2, 2002 (JP) .............................. 2002-256564

(51) Int. Cl.
*B32B 25/20* (2006.01)
(52) U.S. Cl. ...................... 428/447; 428/448; 427/387; 524/588
(58) Field of Classification Search ................. 42/447, 42/448; 427/387; 524/588
See application file for complete search history.

(56) References Cited

U.S. PATENT DOCUMENTS

| 4,842,911 A | * | 6/1989 | Fick ........................... 428/40.4 |
| 6,054,198 A | * | 4/2000 | Bunyan et al. ............. 428/40.5 |
| 6,482,888 B1 | * | 11/2002 | Ahn et al. ................... 524/588 |
| 6,506,828 B1 | * | 1/2003 | Anabuki et al. ............ 524/433 |
| 2004/0043229 A1 | | 3/2004 | Aoki et al. |

FOREIGN PATENT DOCUMENTS

| EP | 0 799 693 A2 | 10/1997 |
| JP | 6-155517 | 6/1994 |
| JP | 09-207275 | 8/1997 |
| JP | 2000-85024 | 3/2000 |
| JP | 2001-212909 | 8/2001 |
| JP | 2002-167511 | 6/2002 |
| JP | 2002-234952 | 8/2002 |

OTHER PUBLICATIONS

Tobolsky, "Polymer Science and Materials", Wiley-Interscience, 1974, pp. 291-292.*
U.S. Appl. No. 10/250,683, filed Jul. 17, 2003, Mita et al.
U.S. Appl. No. 10/643,978, filed Aug. 20, 2003, Aoki et al.
U.S. Appl. No. 09/973,924, filed Oct. 11, 2001, Tomaru et al.
U.S. Appl. No. 10/250,686, filed Jul. 17, 2003, Tomaru et al.
U.S. Appl. No. 10/250,685, filed Jul. 17, 2003, Fujiki et al.
U.S. Appl. No. 11/527,641, filed Sep. 27, 2006, Mita et al.

* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A heat conductive composite sheet comprising (a) a heat softening, heat conductive layer containing a silicone resin and a heat conductive filler, and (b) a heat conductive silicone rubber layer containing a heat conductive filler is ideally suited to use as a heat radiating structure provided between a heat generating electronic component and a heat radiating component such as a heat sink or a circuit board, for the purposes of radiating heat away from the heat generating electronic component and thus cooling it. This heat conductive composite sheet not only offers good thermal conductivity, but if an installed heat conductive member formed from this type of heat conductive composite sheet needs to be removed temporarily to enable the electronic component such as a CPU to be repaired or replaced, the electronic component is not removed together with the heat conductive member.

20 Claims, No Drawings

HEAT CONDUCTIVE COMPOSITE SHEET AND PROCESS FOR PRODUCING SAME

BACKGROUND OF THE INVENTION

1. Field of the Invention

The present invention relates particularly to a heat conductive composite sheet that is ideally suited to use as a heat radiating structure provided between a heat generating electronic component or the like and a heat radiating component such as a heat sink or a circuit board for the purposes of radiating heat away from the heat generating electronic component or the like. The invention also relates to a process for producing this type of composite sheet.

2. Description of the Prior Art

In the circuit design of recent electronic equipment such as televisions, radios, computers, medical instruments, office equipment and communication devices, advances in miniaturization of these devices has led to great increases in complexity in the circuit design. Integrated circuits are now being produced for electronic equipment incorporating hundreds of thousands of transistors. The complexity of the circuit designs continues to increase, while the size of the electronic components continues to shrink, making it possible to incorporate more and more components into even smaller areas, and reducing the dimensions of devices even further.

These electronic components, particularly IC packages such as CPUs and the like that are mounted onto printed circuit boards, suffer from deterioration in performance, faults and other malfunctions as the temperature rises under the influence of heat generated during use of the component. In order to alleviate these problems associated with heat generation, conventionally a heat conductive grease or silicone rubber sheet or the like is disposed between the IC package and a heat sink. However, as the size of electronic components has decreased and the performance has increased, the quantity of heat generated by the components has also increased, meaning the development of members with even better heat radiating properties is being keenly pursued.

An advantage of conventional heat conductive greases is their low interface thermal resistance, meaning they are able to closely contact and follow the surface to which they are applied, and are unaffected by any irregularities in the surface of the electronic component or the heat sink. However such greases also have a number of drawbacks including soiling of other components, bleeding or separation of oil after extended use, and an increase in viscosity over time that leads to the grease bonding too strongly to the coated surface. This strong bonding means that during rework, for example when the heat conductive member must be removed temporarily to enable the electronic component to be repaired or replaced, the electronic component such as a CPU tends to be removed together with the heat conductive member.

Heat conductive silicone rubber sheets offer different advantages in that they are easy to mount, and display good reworkability. However, these sheets also have drawbacks, including an upper limit to the quantity of heat conductive filler that can be incorporated within the rubber sheet, in order to maintain sufficient workability during the production process, increased likelihood of unsatisfactory ability of the sheet to closely contact and follow the surface to which it is applied, and inadequate heat radiating performance due to a large interface thermal resistance when the sheet is mounted.

As a possible solution to the above problems, heat radiating sheets comprising a layer with heat softening characteristics have been disclosed in Published Japanese translations of PCT international publication (kohyo) No. 2000-509209 (JP2000-509209A) and Japanese Laid-open publication (kokai) No. 2000-327917 (JP2000-327917A). However with these sheets, although the heat softened resin component follows and closely contacts the surface to which it is applied, leaving no gaps and preventing any increase in interface thermal resistance, problems still remain. Namely, there is still an upper limit to the quantity of heat conductive filler that can be incorporated within the sheet, in a similar manner to conventional rubber sheets, the resin itself can sometimes become a cause of interface thermal resistance, and in some cases the sheet may bond too strongly to the coated surface after extended use at high temperature, in a similar manner to the heat conductive greases described above, resulting in a deterioration in reworkability.

SUMMARY OF THE INVENTION

An object of the present invention is to provide a heat conductive composite sheet, which is particularly suited to use as a heat radiating sheet for heat generating electronic components, and displays not only excellent thermal conductivity, but also excellent reworkability, as well as a process for producing such a sheet.

In order to achieve the above object, the present invention provides a heat conductive composite sheet comprising (a) a heat softening, heat conductive layer containing a silicone resin and a heat conductive filler, and (b) a heat conductive silicone rubber layer containing a heat conductive filler. The present invention also provides a process for producing such a heat conductive composite sheet.

DETAILED DESCRIPTION OF THE PREFERRED EMBODIMENTS

As follows is a more detailed description of the present invention.

[(a) Heat Softening, Heat Conductive Layer]

In a heat conductive composite sheet of the present invention, a heat softening, heat conductive layer of the layer (a) is basically formed from a composition comprising a silicone resin that functions as a matrix phase, and a heat conductive filler that is dispersed within the matrix phase. This layer (a) is the layer of a composite sheet according to the present invention that contacts the heat generating electronic component, and provides two major functions. Firstly, when the heat generating electronic component is operated, the heat generated by the component causes at least the surface of the layer (a) that is in contact with the heat generating electronic component to undergo a reduction in viscosity, and either soften or melt, enabling the surface of the layer (a) to follow and closely contact the component surface, thereby preventing any gaps between the layer and the component, and preventing any increase in interface thermal resistance. Secondly, because the layer (a) contains a high proportion of a heat conductive filler, the thermal conductivity is high, enabling the heat radiating characteristics of the heat conductive composite sheet to be improved.

<Silicone Resin Component>

Any silicone resin is suitable as the silicone resin used within the present invention, provided the composition of the layer (a), which comprises the silicone resin and a heat conductive filler, is essentially solid at room temperature, but reduces in viscosity, and either softens or melts, so that at least the surface of the layer (a) that contacts the heat generating electronic component becomes fluid, at temperatures within a range between 40° C. and the maximum temperature reached due to the heat generated by the heat generating electronic component, namely from 40 to 100° C., and preferably from 40 to 90° C. The silicone resin, which functions as the matrix phase, is an important factor in determining the heat softening characteristics of the layer (a).

What is described here as the temperature at which a reduction in viscosity, and either softening or melting occurs, refers to the temperature for the composition, and this temperature does not preclude those cases in which the silicone resin itself has a melting point of less than 40° C. However, compositions for which a large portion of the layer (a), outside the aforementioned contact surface region, becomes fluid as a result of the silicone resin of the matrix phase melting within the temperature range described above are unsuitable.

Furthermore, the silicone resin must have a molecular weight that is sufficient to support the heat conductive filler that is tightly packed and dispersed within the layer (a). In addition, the silicone resin must provide excellent adhesion between the layer (a) and the heat conductive silicone rubber layer of the layer (b), so that there is no danger of separation at the interface between the two layers.

There are no particular restrictions on the silicone resin of the matrix phase of the layer (a), and any silicone resin which satisfies the above conditions may be used. However, considering the requirement that the composition formed in combination with the heat conductive filler must be essentially solid, namely non-fluid, at room temperature, suitable examples of the silicone resin include polymers incorporating $RSiO_{3/2}$ units (hereafter referred to as T units) and/or $SiO_2$ units (hereafter referred to as Q units), and copolymers of these units with $R_2SiO$ units (hereafter referred to as D units). Silicone resins formed by adding a polydiorganosiloxane comprised of D units and terminal $R_3SiO_{1/2}$ units (M units), in the form of silicone oil or silicone gum, to the above polymers or copolymers may also be used. Of these resins, silicone resins comprising T units and D units, and combinations of a silicone resin comprising T units, with a polydiorganosiloxane in the form of silicone oil or silicone gum with a viscosity at 25° C. of at least 100 Pa·s are preferred. The silicone resin may also have the terminals blocked with $R_3SiO_{1/2}$ units (M units).

The aforementioned R group is an unsubstituted or substituted monovalent hydrocarbon group of 1 to 10 carbon atoms, and preferably 1 to 6 carbon atoms. Specific examples include alkyl groups such as methyl groups, ethyl groups, propyl groups, isopropyl groups, butyl groups, isobutyl groups, tert-butyl groups, pentyl groups, neopentyl groups, hexyl groups, octyl groups, nonyl groups and decyl groups; cycloalkyl groups such as cyclohexyl groups; aryl groups such as phenyl groups, tolyl groups, xylyl groups and naphthyl groups; aralkyl groups such as benzyl groups, phenylethyl groups and phenylpropyl groups; alkenyl groups such as vinyl groups, allyl groups, propenyl groups, isopropenyl groups, butenyl groups, hexenyl groups, cyclohexenyl groups and octenyl groups; and groups in which either a portion of, or all of the hydrogen atoms of the aforementioned groups have been substituted with halogen atoms such as fluorine atoms, bromine atoms or chlorine atoms, or cyano groups, including chloromethyl groups, chloropropyl groups, bromoethyl groups, trifluoropropyl groups and cyanoethyl groups. Of these, methyl groups, phenyl groups and vinyl groups are particularly preferred.

Describing the silicone resin in further detail, the silicone resin can incorporate T units and/or Q units, and can be designed with combinations of M units and T units, or combinations of M units and Q units. However, introducing T units is an effective method of ensuring excellent toughness in the solid state, namely improving the brittleness and preventing breakage during handling, and the resin should also preferably contain D units in addition to the T units. The substituent group (R) of the T units should preferably be a methyl group or a phenyl group, and the substituent groups (R) of the D units should preferably be methyl groups, phenyl groups or vinyl groups. The ratio of T units to D units should be within a range from 10:90 to 90:10, and preferably from 20:80 to 80:20.

Even for resins synthesized from typically used M units and T units, or M units and Q units, the addition to the resin of a high viscosity oil (of at least 100 Pa·s) or a gum polymer containing T units, and formed mainly from D units with M units at both terminals, improves the brittleness of the resin, and furthermore also prevents pumping out, namely, the formation of gas bubbles or the bleeding of the base siloxane as a result of separation of the filler and the base siloxane, in the case of a heat shock. Accordingly, in those cases in which a silicone resin containing T units but containing no D units is used, a high viscosity oil or a gum compound or the like containing D units as a main component should preferably be added to the silicone resin.

Accordingly, in those cases in which a silicone resin with a softening point that is higher than room temperature incorporates T units but incorporates no D units, then provided a high viscosity oil or a gum or the like containing D units as a main component is added, a material with excellent handling properties can be produced. In such cases, in order to prevent pumping out and ensure a good level of heat radiating performance, the quantity added of the high viscosity oil or gum compound or the like containing D units as a main component is typically within a range from 1 to 100 parts by weight, and preferably from 2 to 10 parts by weight, per 100 parts by weight of the silicone resin with a softening point or a melting point that is higher than room temperature.

In order to achieve the critical viscosity reduction as described above, the silicone resin should preferably have a comparatively low molecular weight. The molecular weight of this type of low melting point silicone resin is typically within a range from 500 to 10,000, and preferably from 1000 to 6000.

Silicone resins which impart both flexibility and tackiness, where this tackiness is necessary to ensure temporary fixing of the heat radiating sheet to an electronic component or a heat sink, to the layer (a) of a heat conductive composite sheet of the present invention are ideal. A polymer or the like with a single viscosity may be used. Using a mixture of two or more polymers with different viscosities can also be advantageous, as it enables the production of a sheet with an excellent balance between flexibility and tackiness.

Specific examples of such resins include the silicone resins with a specific composition of bifunctional structural units (D units) and trifunctional structural units (T units), as shown below.

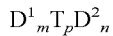

(wherein, $D^1$ represents a dimethysiloxane unit (namely, $(CH_3)_2SiO$), T represents a phenylsiloxane unit (namely, $(C_6H_5)SiO_{3/2}$), $D^2$ represents a methylvinylsiloxane unit (namely, (CH₃)(CH₂=CH)SiO), the composition ratio (m+n)/p (molar ratio) is within a range from 0.25 to 4.0, and the ratio (m+n)/m (molar ratio) is within a range from 1.0 to 4.0.)

Other examples include the silicone resins with a specific composition of monofunctional structural units (M units), bifunctional structural units (D units), and trifunctional structural units (T units), as shown below.

$$M_l D^1{}_m T_p D^2{}_n$$

(wherein, M represents a trimethylsiloxane unit (that is, $(CH_3)_3SiO_{1/2}$), $D^1$, T and $D^2$ are as described above, the composition ratio (m+n)/p (molar ratio) is within a range from 0.25 to 4.0, the ratio (m+n)/m (molar ratio) is within a range from 1.0 to 4.0, and the ratio l/(m+n) is within a range from 0.001 to 0.1.)

In addition, further examples include the silicone resins with a specific composition of monofunctional structural units (M units), bifunctional structural units (D units), and tetrafunctional structural units (Q units), as shown below.

$$M_l D^1{}_m Q_q D^2{}_n$$

(wherein, Q represents $SiO_{4/2}$, M, $D^1$ and $D^2$ are as described above, the composition ratio (m+n)/q (molar ratio) is within a range from 0.25 to 4.0, the ratio (m+n)/m (molar ratio) is within a range from 1.0 to 4.0, and the ratio l/(m+n) is within a range from 0.001 to 0.1.)

The above silicone resins can be used singularly, or in combinations of two or more different resins.

<Heat Conductive Filler>

There are no particular restrictions on the heat conductive filler described above, and most known heat conductive filler materials can be used. Specific examples include metals such as copper, silver and aluminum; metal oxides such as alumina, silica, magnesium oxide, and zinc oxide; metal nitrides such as aluminum nitride, silicon nitride, and boron nitride; as well as other materials such as artificial diamond.

From the viewpoints of ensuring good workability during production of the aforementioned composition of the layer (a), and achieving a good level of heat radiating performance as a heat radiating member, the average particle diameter of the heat conductive filler should preferably fall within a range from 0.1 to 100 μm, and using a filler with an average particle diameter within a range from 0.1 to 25 μm, enables the preparation of a composition which combines good fluidity and good heat conducting characteristics, which is very desirable.

There are no particular restrictions on the shape of the particles of the heat conductive filler, although a spherical shape is preferred. Furthermore, the heat conductive filler may be either a single type of filler, or a combination of two or more different types of filler. If a mixture of two or more fillers with different average particle diameters is used, then a situation approaching the closest possible packing can be expected, producing an even better thermal conductivity, and consequently this type of mixture is recommended. From the viewpoints of thermal conductivity and heat softening characteristics, the quantity of this heat conductive filler is typically within a range from 70 to 97% by weight, and preferably from 85 to 95% by weight, of the entire composition used to form the layer (a).

<Other Additives>

Where necessary, other additives or fillers typically used in synthetic rubbers may also be used in the composition used to form the layer (a).

Specific examples of other additives that can be added include shape retention agents such as EPT polymers; adhesion improvement agents such as olefin based adhesives; mold releasing agents such as silicone oil or fluorine modified silicone surfactants; coloring agents such as carbon black, titanium dioxide and red iron oxide; flame resistance imparting agents including platinum compounds, metal oxides such as iron oxide, titanium oxide and cerium oxide, and metal hydroxides; agents for improving the composition workability such as process oil, reactive silanes or siloxanes, reactive titanate based compounds and reactive aluminum based compounds; and other materials for improving the workability and ease of handling including solvents such as toluene, xylene, hexane, heptane, acetone, and methyl ethyl ketone.

[(b) Heat Conductive Silicone Rubber Layer]

A heat conductive silicone rubber layer which forms the layer (b) of a heat conductive composite sheet of the present invention is a backing material that supports the dimensional stability of the heat softening, heat conductive layer (a). The layer (b) has a comparatively high hardness value and displays excellent adhesion to the layer (a), thereby imparting a good level of reworkability to a composite sheet of the present invention.

There are no particular restrictions on the variety of this heat conductive silicone rubber layer, provided it contains a heat conductive filler. However, in terms of achieving the desired levels of shape retention and reinforcement for the heat conductive composite sheet, ensuring good levels of productivity, and achieving good adhesion and following characteristics for the sheet relative to electronic components, the hardness of the heat conductive silicone rubber layer, reported in terms of ASCAR C hardness, is preferably within a range from 5 to 100, and even more preferably from 10 to 50. ASCAR C hardness refers to the hardness measured based on SRIS 0101 (The Japanese Rubber Association Standard) and JIS S 6050, using an ASCAR C spring type hardness tester.

Next is a description of the curable silicone rubber composition that functions as the raw material for the heat conductive silicone rubber layer of the layer (b).

<Addition Reaction Curable Silicone Rubber Compositions>

An addition reaction curable silicone rubber composition comprises essentially (A) an polyorganosiloxane with at least 2 alkenyl groups within each molecule, (B) an polyorganohydrogensiloxane with at least 2 hydrogen atoms bonded to silicon atoms within each molecule, and (C) a platinum based catalyst.

Provided the polyorganosiloxane of the component (A) is a liquid, there are no particular restrictions on the molecular structure, and straight chain structures, branched chain structures, and straight chain structures with partial branching are all suitable, although straight chain structures or straight chain structures with partial branching are preferred. Furthermore, the polyorganosiloxane may comprise a single polymer with one of these molecular structures, a copolymer formed from these molecular structures, or a mixture of different polymers with one of the above molecular structures.

Examples of the alkenyl groups include vinyl groups, allyl groups, butenyl groups, pentenyl groups and hexenyl groups, although from the viewpoints of ease of synthesis and cost, vinyl groups are preferred. The alkenyl groups may be bonded at the molecular chain terminals or to side chains, although at least one alkenyl group is preferably bonded to a silicon atom at a terminal of the molecular chain, and from the viewpoint of flexibility, polyorganosiloxane s with alkenyl groups bonded only at the two molecular chain terminals are particularly preferred.

Suitable examples of groups other than the alkenyl groups that may be bonded to silicon atoms within the polyorganosiloxane include alkyl groups such as methyl groups, ethyl groups, propyl groups, butyl groups, pentyl groups, hexyl groups, heptyl groups, octyl groups, nonyl groups, decyl groups and octadecyl groups; cycloalkyl groups such as cyclopentyl groups and cyclohexyl groups; aryl groups such as phenyl groups, tolyl groups, xylyl groups and naphthyl groups; aralkyl groups such as benzyl groups, phenethyl groups and 2-phenylpropyl groups; and halogenated alkyl groups such as chloromethyl groups, 3,3,3-trifluoropropyl groups, and 3-chloropropyl groups. Of these, from the viewpoints of ease of synthesis and cost, at least 90 mol % of the total number of these groups are preferably methyl groups.

In order to achieve good shape retention characteristics for the layer (b), and a good level of workability for the produced addition reaction curable silicone rubber composition, the viscosity of the component (A) at 25° C. is preferably within a range from 10 to 100,000 mPa·s, and even more preferably from 100 to 50,000 mPa·s.

Specific examples of the component (A) include copolymers of dimethylsiloxane and methylvinylsiloxane with both molecular chain terminals blocked with trimethylsiloxy groups, polymethylvinylsiloxane with both molecular chain terminals blocked with trimethylsiloxy groups, copolymers of dimethylsiloxane, methylvinylsiloxane and methylphenylsiloxane with both molecular chain terminals blocked with trimethylsiloxy groups, polydimethylsiloxane with both molecular chain terminals blocked with dimethylvinylsiloxy groups, polymethylvinylsiloxane with both molecular chain terminals blocked with dimethylvinylsiloxy groups, copolymers of dimethylsiloxane and methylvinylsiloxane with both molecular chain terminals blocked with dimethylvinylsiloxy groups, copolymers of dimethylsiloxane, methylvinylsiloxane and methylphenylsiloxane with both molecular chain terminals blocked with dimethylvinylsiloxy groups, and polydimethylsiloxane with both molecular chain terminals blocked with trivinylsiloxy groups. These materials may be used singularly, or in combinations of two or more different materials.

The polyorganohydrogensiloxane of the component (B) functions as a cross linking agent. Provided the polyorganohydrogensiloxane is a liquid, there are no particular restrictions on the molecular structure, and straight chain structures, branched chain structures, and straight chain structures with partial branching are all suitable, although straight chain structures or straight chain structures with partial branching are preferred. Furthermore, the polyorganohydrogensiloxane may comprise a single polymer with one of these molecular structures, a copolymer formed from these molecular structures, or a mixture of different polymers with one of the above molecular structures. In terms of achieving a cured product with a satisfactory network structure and adequate hardness, preventing the generation of foaming, and ensuring a satisfactory level of flexibility for the produced heat conductive silicone rubber layer, the quantity of the component (B) should be a quantity such that the number of hydrogen atoms bonded to silicon atoms (SiH groups) within the component (B) is within a range from 0.6 to 5.0, and preferably within a range from 0.8 to 4.0, for each alkenyl group within the component (A).

Specific examples of the component (B) include polymethylhydrogensiloxane with both molecular chain terminals blocked with trimethylsiloxy groups, copolymers of dimethylsiloxane and methylhydrogensiloxane with both molecular chain terminals blocked with trimethylsiloxy groups, copolymers of dimethylsiloxane, methylhydrogensiloxane and methylphenylsiloxane with both molecular chain terminals blocked with trimethylsiloxy groups, polydimethylsiloxane with both molecular chain terminals blocked with dimethylhydrogensiloxy groups, copolymers of dimethylsiloxane and methylhydrogensiloxane with both molecular chain terminals blocked with dimethylhydrogensiloxy groups, copolymers of dimethylsiloxane and methylphenylsiloxane with both molecular chain terminals blocked with dimethylhydrogensiloxy groups, and polymethylphenylsiloxane with both molecular chain terminals blocked with dimethylhydrogensiloxy groups. These materials may be used singularly, or in combinations of two or more different materials.

The platinum based catalyst of the component (C) is a catalyst for accelerating the curing of the composition, and suitable examples include chloroplatinic acid, alcohol solutions of chloroplatinic acid; olefin complexes of platinum, alkenylsiloxane complexes of platinum, and carbonyl complexes of platinum. There are no particular restrictions on the quantity of the platinum based catalyst used, which need only be an effective catalytic quantity, although a typical quantity, calculated as the weight of the platinum metal within the catalyst relative to the weight of the component (A), is within a range from 0.01 to 1,000 ppm, and preferably from 0.1 to 500 ppm.

<Condensation Curable Silicone Rubber Compositions>

A condensation curable silicone rubber composition comprises essentially (1) an polyorganosiloxane with at least 2 silanol groups or hydrolysable groups bonded to silicon atoms within each molecule, (2) a curing agent comprising a silane compound with at least 3 hydrolysable groups bonded to silicon atoms within each molecule, or a partial hydrolysis-condensation product thereof, and (3) if required, a condensation curing catalyst.

The polyorganosiloxane of the component (1) preferably has a viscosity at 25° C. within a range from 10 to 100,000 mPa·s. Furthermore, suitable examples of the hydrolysable groups within this polyorganosiloxane include acyloxy groups such as acetoxy groups, octanoyloxy groups and benzoyloxy groups; ketoxime groups such as dimethylketoxime groups, methylethylketoxime groups and diethylketoxime groups; alkoxy groups such as methoxy groups, ethoxy groups and propoxy groups; alkoxyalkoxy groups such as methoxyethoxy groups, ethoxyethoxy groups and methoxypropoxy groups; alkenoxy groups such as vinyloxy groups, isopropenyloxy groups and 1-ethyl-2-methylvinyloxy groups; amino groups such as dimethylamino groups, diethylamino groups, butylamino groups and cyclohexylamino groups; aminoxy groups such as dimethylaminoxy groups and diethylaminoxy groups; and amide groups such as N-methylacetamide groups, N-ethylacetamide groups and N-methylbenzamide groups.

Specific examples of the component (1) include polydimethylsiloxane with both molecular chain terminals blocked with silanol groups, copolymers of dimethylsiloxane and methylphenylsiloxane with both molecular chain terminals blocked with silanol groups, polydimethylsiloxane with both molecular chain terminals blocked with trimethoxysiloxy groups, copolymers of dimethylsiloxane and methylphenylsiloxane with both molecular chain terminals blocked with trimethoxysiloxy groups, polydimethylsiloxane with both molecular chain terminals blocked with methyldimethoxysiloxy groups, polydimethylsiloxane with both molecular chain terminals blocked with triethoxysiloxy groups, and polydimethylsiloxane with both molecular chain terminals blocked with 2-trimethoxysiloxyethyl groups. These materials may be used singularly, or in combinations of two or more different materials.

Specific examples of the curing agent of the component (2) include ethyl silicate, propyl silicate, methyltrimethoxysilane, methyltriethoxysilane, vinyltrimethoxysilane, vinyltriethoxysilane, methyltri(methoxyethoxy)silane, vinyltri(methoxyethoxy)silane, methyltripropenoxysilane, methyltriacetoxysilane, vinyltriacetoxysilane, methyltri(methylethylketoxime)silane, vinyltri(methylethylketoxime)silane, phenyltri(methylethylketoxime)silane, propyltri(methylethylketoxime)silane, tetra(methylethylketoxime)silane, 3,3,3-trifluoropropyltri(methylethylketoxime)silane, 3-chloropropyltri(methylethylketoxime)silane, methyltri(dimethylketoxime)silane, methyltri(diethylketoxime)silane, methyltri(dipropylketoxime)silane and methyltri(cyclohexanoxime)silane, as well as partial hydrolysis-condensation products thereof. These compounds may be used singularly, or in combinations of two or more different compounds.

In terms of the storage stability, adhesion, and curing speed of the product composition, the quantity of the component (2) used is typically within a range from 0.01 to 20 parts by weight, and preferably from 0.1 to 10 parts by weight, per 100 parts by weight of the component (1).

The condensation curing catalyst of the component (3) is an optional component. Suitable examples of the catalyst include organic titanate esters such as tetrabutyl titanate and tetraisopropyl titanate; organic titanium chelate compounds such as titanium diisopropoxybis(ethylacetoacetate); organic aluminum compounds such as aluminum tris(acetylacetonate) and aluminum tris(ethylacetoacetate); organic zirconium compounds such as zirconium tetra(acetylacetonate) and zirconium tetrabutyrate; organotin compounds such as dibutyl tin dioctoate, dibutyl tin dilaurate and dibutyl tin di(2-ethylhexanoate); metal salts of organic carboxylic acids such as tin naphthenate, tin oleate, tin butyrate, cobalt naphthenate and zinc stearate; amine compounds such as hexylamine and dodecylamine phosphate, or the salts thereof; quaternary ammonium salts such as benzyltriethylammonium acetate; lower fatty acid salts of alkali metals such as potassium acetate; dialkylhydroxylamines such as dimethylhydroxylamine and diethylhydroxylamine; and guanidyl group containing organosilicon compounds. These compounds may be added singularly, or in combinations of two or more compounds.

In those cases in which the component (3) is added, there are no particular restrictions on the quantity of the catalyst, and an effective catalytic quantity is adequate. Typical quantities are from 0.01 to 20 parts by weight, and preferably from 0.1 to 10 parts by weight, per 100 parts by weight of the component (1).

<Radical Reaction Curable Silicone Rubber Compositions>

A radical reaction curable silicone rubber composition comprises essentially an polyorganosiloxane and an organic peroxide compound, and although there are no particular restrictions on the polyorganosiloxane, compounds with at least 2 alkenyl groups within each molecule are preferred. Vinyl groups are particularly preferred as these alkenyl groups. Examples of other groups that may be bonded to silicon atoms within the polyorganosiloxane include the alkyl groups and aryl groups described above, and methyl groups and phenyl groups are particularly preferred.

Specific examples of this type of polyorganosiloxane include polydimethylsiloxane with both molecular chain terminals blocked with dimethylvinylsiloxy groups, polydimethylsiloxane with both molecular chain terminals blocked with methylphenylvinylsiloxy groups, copolymers of dimethylsiloxane and methylphenylsiloxane with both molecular chain terminals blocked with dimethylvinylsiloxy groups, copolymers of dimethylsiloxane and methylvinylsiloxane with both molecular chain terminals blocked with dimethylvinylsiloxy groups, copolymers of dimethylsiloxane and methylvinylsiloxane with both molecular chain terminals blocked with trimethylsiloxy groups, polymethyl(3,3,3-trifluoropropyl)siloxane with both molecular chain terminals blocked with dimethylvinylsiloxy groups, copolymers of dimethylsiloxane and methylvinylsiloxane with both molecular chain terminals blocked with silanol groups, and copolymers of dimethylsiloxane, methylvinylsiloxane and methylphenylsiloxane with both molecular chain terminals blocked with silanol groups. These materials may be used singularly, or in combinations of two or more different materials.

Suitable examples of the aforementioned organic peroxide include benzoyl peroxide, dicumyl peroxide, 2,5-dimethyl-2,5-bis-(t-butylperoxy)hexane, di-t-butyl peroxide and t-butylperbenzoate. These compounds may be used singularly, or in combinations of two or more different compounds. The quantity added of this organic peroxide is preferably within a range from 0.1 to 5 parts by weight per 100 parts by weight of the aforementioned polyorganosiloxane.

<Heat Conductive Filler>

The heat conductive filler that is added to, and mixed with, one of the types of curable silicone rubber compositions described above can utilize basically the same materials described in relation to the aforementioned composition of the layer (a), although from the viewpoint of ensuring good affinity with the layer (a), it is preferable that the same material as that used in the composition of the layer (a) is used. In terms of the thermal conductivity and flexibility of the heat conductive composite sheet, the quantity of this heat conductive filler is typically within a range from 60 to 95% by weight, and preferably from 70 to 90% by weight, of the entire curable silicone rubber composition of the layer (b).

<Other Secondary Materials and Additives>

In order to further improve the shape stability of the layer (b), if desired, an additional sheet of glass cloth, graphite, or aluminum foil or the like may be bonded to the outer surface of the layer (b), either using a method such as thermocompression bonding, or using an adhesive. Furthermore, incorporating the glass cloth or the like as an integrated intermediate layer of the layer (b) is also possible.

Furthermore, in a similar manner to the layer (a), other additives or fillers typically used in curable synthetic rubber compositions may also be added to the curable silicone rubber composition used to form the layer (b). Specific examples of other additives that can be added include control agents that are added to suppress catalytic activity, including acetylene compounds such as 1-ethynyl-1-cyclohexanol, the various nitride compounds, organic phosphorus compounds, oxime compounds, and organic chloro compounds; mold releasing agents such as silicone oil or fluorine modified silicone surfactants; coloring agents such as carbon black, titanium dioxide and red iron oxide; flame resistance imparting agents including platinum compounds, metal oxides such as iron oxide, titanium oxide and cerium oxide, and metal hydroxides; and agents for improving the composition workability such as reactive silanes or siloxanes.

[Optional Intermediate Layers]

At least one intermediate layer, such as, e.g., a layer of polyimide, graphite, glass cloth, aluminum foil, or copper foil may be present between the layers (a) and (b) described above.

[Production of the Heat Conductive Silicone Rubber Sheet]

As follows is a detailed description of the process for producing a heat conductive composite sheet of the present invention formed from (a) a heat softening, heat conductive layer, and (b) a heat conductive silicone rubber layer.

The present invention provides the following representative processes for production of the heat conductive composite sheet.

(1) A process for producing the heat conductive composite sheet, comprising:

providing said heat conductive silicone rubber layer of (b), optionally forming at least one intermediate layer on top of said heat conductive silicone rubber layer of (b), and forming a layer of said composition on top of said heat conductive silicone rubber layer of (b) or, if said intermediate layer is present, on top of the intermediate layer.

(2) A process for producing the heat conductive composite sheet, comprising:

providing said heat softening, heat conductive layer containing a silicone resin and a heat conductive filler of (a), forming a layer of a liquid, curable silicone rubber composition comprising a heat conductive filler on top of said heat softening, heat conductive layer of (a), and curing said composition to form said heat conductive silicone rubber layer of (b).

(3) A process for producing the heat conductive composite sheet, comprising:

subjecting a heat softening, heat conductive sheet containing a silicone resin and a heat conductive filler, and a heat conductive silicone rubber sheet containing a heat conductive filler to thermocompression bonding together.

These processes above will be described more specifically below with reference to embodiments thereof.

<Heat Conductive Silicone Rubber Sheet>

In those cases where a preformed heat conductive silicone rubber sheet is used, a process such as that described below can be used.

For example, an uncured, addition reaction curable silicone rubber composition in liquid form, containing a heat conductive filler, is poured into a mold, the mold is closed, pressure within a range from 49.0 kPa (0.5 kgf/cm$^2$) to 4903.5 kPa (50 kgf/cm$^2$) is applied using a heat press device, the temperature is raised to a temperature within a range from 100 to 180° C., and the composition is maintained under these conditions for 5 to 30 minutes to mold and cure the liquid silicone rubber composition, yielding a heat conductive silicone rubber sheet.

<Heat Softening, Heat Conductive Sheet with Attached Polymer Film that has Undergone Mold Release Treatment>

When forming a heat softening, heat conductive sheet, it is advantageous to use a polymer film that has undergone a mold release treatment as a shape retention secondary material. Examples of polymer films that have undergone mold release treatment include polyethylene terephthalate film to which a coating of a fluorine based mold releasing agent has been applied, polypropylene film to which a coating of a silicone based mold releasing agent has been applied, polyethylene terephthalate film to which a coating of a silicone based mold releasing agent has been applied, and polypropylene film to which a coating of a silicone based mold releasing agent has been applied. Following formation of the heat conductive composite sheet, prior to actual application of the sheet onto a heat generating electronic component, this polymer film is peeled off and removed.

In those cases where a preformed heat conductive silicone rubber sheet with an attached polymer film that has undergone mold release treatment is used, a process such as that described below can be used.

A tape type polymer film that has undergone mold release treatment is supplied to a coating apparatus, and a liquid form silicone resin composition containing a heat conductive filler, that has been diluted by mixing with a solvent such as toluene to improve the workability, is applied to the surface of the treated polymer film with a knife coater at a coating rate of 0.5 to 3.0 m/min to generate a predetermined thickness. The coated film is then passed through a heating furnace at 50 to 200° C. to volatilize and remove the toluene, yielding a heat softening, heat conductive sheet with an attached polymer film that has undergone mold release treatment.

<Die Molding Method-1>

This is a method in which a heat conductive silicone rubber sheet is placed on the surface of a die, a silicone resin composition containing a heat conductive filler is placed on top of the silicone rubber sheet, the mold is closed using a separate die to which a polymer film that has undergone mold release treatment has been applied, and heat and pressure are then applied using a heat press device, thereby softening the composition and completing the molding of a heat conductive composite sheet.

There are no particular restrictions on the molding conditions used, which should be set according to the point at which the matrix component of the composition becomes fluid and moldable. The temperature is preferably within a range from 100 to 200° C., and even more preferably from 120 to 180° C. In order to avoid the incorporation of gas bubbles, the pressure conditions typically require a surface pressure within a range from 49.0 to 1961.4 kPa (0.5 to 20 kgf/cm$^2$).

<Die Molding Method-2>

This is a method in which a heat softening, heat conductive sheet with an attached polymer film that has undergone mold release treatment is placed on the surface of a die, an uncured, addition reaction curable, liquid silicone rubber composition containing a heat conductive filler is poured on top of the silicone rubber sheet, the die assembly is closed, and heat and pressure are then applied using a heat press device, thereby curing the liquid silicone rubber composition and completing the molding of a heat conductive composite sheet.

There are no particular restrictions on the molding conditions used, which can employ the typical conditions employed when curing and molding a curable silicone rubber composition by press molding. The temperature is preferably within a range from 50 to 200° C., and even more preferably from 60 to 180° C. In order to avoid the incorporation of gas bubbles, the pressure conditions typically require a surface pressure within a range from 490.4 to 4903.5 kPa (5 to 50 kgf/cm$^2$).

<Injection Molding Method-1>

This is a method in which a heat conductive silicone rubber sheet is placed on the die surface of an injection molding apparatus, and the mold is then closed using a separate die to which a polymer film that has undergone mold release treatment has been applied. A silicone resin composition containing a heat conductive filler is then softened in a heated barrel, and injected from a nozzle, through the sprue and into the mold, filling the mold, which is then placed under pressure. Following cooling, the die assembly is opened and the molded heat conductive composite sheet is removed.

There are no particular restrictions on the molding conditions used, which should be set according to the point at which the matrix component of the component becomes fluid and moldable. The barrel temperature is preferably within a range from 50 to 150° C., and even more preferably from 70 to 130° C. In order to avoid the incorporation of gas bubbles, the pressure conditions typically require a surface pressure within a range from 49.04 kPa (0.5 kgf/cm$^2$) to 4903.5 kPa (50 kgf/cm$^2$).

<Injection Molding Method-2>

This is a method in which a heat softening, heat conductive sheet with an attached polymer film that has undergone mold release treatment is placed on the heated die surface of an injection molding apparatus, and the mold is then closed. An uncured, addition reaction curable, liquid silicone rubber composition containing a heat conductive filler is then poured into a raw material supply pump, and injected from a fixed discharge pump, through the sprue and into the mold, filling the mold, which is then placed under pressure. Following curing, the die assembly is opened and the molded heat conductive composite sheet is removed.

There are no particular restrictions on the molding conditions used, which can employ the typical conditions employed when curing and molding a curable silicone rubber composition by injection molding. The temperature of the heated die is preferably within a range from 50 to 200° C., and even more preferably from 60 to 180° C. In order to avoid the incorporation of gas bubbles, the pressure conditions typically require a surface pressure within a range from 49.04 kPa (0.5 kgf/cm$^2$) to 4903.5 kPa (50 kgf/cm$^2$).

<Coating Molding Method-1>

This is a method in which a tape type heat conductive silicone rubber sheet is supplied to a coating apparatus, and a liquid form silicone resin composition containing a heat conductive filler, that has been diluted with a solvent to improve the workability, is applied to the surface of the heat conductive silicone rubber sheet with a knife coater to generate a predetermined thickness, and then passed through a heating furnace to volatilize and remove the solvent, thereby completing the molding of a heat conductive composite sheet.

There are no particular restrictions on the molding conditions, which need only be sufficient to volatilize and remove the solvent. The coating rate is preferably within a range from 0.5 to 10 m/min., and even more preferably 1 to 5 m/min. The temperature of the heating furnace will vary depending on the solvent used, although in order to avoid the incorporation of gas bubbles, temperatures within a range from 50 to 200° C. are preferred, and temperatures from 60 to 180° C. are even more desirable. In addition, from the viewpoints of lowering the viscosity, and maintaining good heat softening and melting characteristics for the layer (a), a polymer film that has undergone mold release treatment should be bonded to the surface of the layer (a).

<Coating Molding Method-2>

This is a method in which a tape type, heat softening, heat conductive sheet with an attached polymer film that has undergone mold release treatment is supplied to a coating apparatus, and an uncured, addition reaction curable, liquid silicone rubber composition containing a heat conductive filler, is applied to the surface of the heat softening, heat conductive sheet with an attached polymer film that has undergone mold release treatment with a knife coater to generate a predetermined thickness, and then passed through a heating furnace to cure, thereby completing the molding of a heat conductive composite sheet.

There are no particular restrictions on the molding conditions, which need only be sufficient to enable curing and molding of the curable silicone rubber composition by the coating molding method. The coating rate is preferably within a range from 0.5 to 10 m/min., and even more preferably 1 to 5 m/min. In order to avoid the incorporation of gas bubbles, the temperature of the heating furnace is preferably within a range from 50 to 200° C., and even more preferably from 60 to 180° C.

<Thermocompression Molding Method>

This is a method in which a tape type, heat softening, heat conductive silicone rubber sheet, and a tape type, heat softening, heat conductive sheet with an attached polymer film that has undergone mold release treatment are supplied simultaneously to heated rollers, and subjected to thermocompression molding by these rollers, thereby molding a heat conductive composite sheet.

There are no particular restrictions on the molding conditions used, which should be set according to the point at which the matrix component of the heat softening, heat conductive sheet softens or becomes fluid. The temperature of the heated rollers is preferably within a range from 100 to 200° C., and even more preferably from 120 to 180° C. In order to avoid the incorporation of gas bubbles, the pressure conditions typically require a surface pressure within a range from 49.0 to 1961.4 kPa (0.5 to 50 kgf/cm$^2$).

EXAMPLES

As follows is a more specific description of the present invention using a series of examples and comparative examples, although the present invention is in no way restricted to the examples presented below. The numbers in Table 1 refer to parts by weight.

First is a description of the components of the compositions for the layers (a) and (b) used in forming heat conductive composite sheets according to the present invention, and the processes for preparing those compositions.

<Components of Heat Softening, Heat Conductive Layers>

Component (F): Matrix Component

F-1: A polysiloxane represented by the compositional formula shown below.

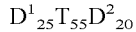

$D^1{}_{25}T_{55}D^2{}_{20}$ (wherein, $D^1$ represents a dimethylsiloxane unit (that is, $(CH_3)_2SiO$), T represents a phenylsiloxane unit (that is, $(C_6H_5)SiO_{3/2}$), and $D^2$ represents a methylvinylsiloxane unit (that is, $(CH_3)(CH_2=CH)SiO$)

Component (G): Polyolefin (for Comparison)

G-1: Dialen 30 (trade name, manufactured by Mitsubishi Chemical Corporation)

G-2: Dialen 208 (trade name, manufactured by Mitsubishi Chemical Corporation)

Component (H): Shape Retention Agent (for Comparison)
   H-1: EPT-PX-055 (trade name, manufactured by Mitsui Chemicals Inc.)

Component (I): Adhesion Improvement Agent (for Comparison)
   I-1: Lucant HC3000X (trade name, manufactured by Mitsui Chemicals Inc.)

Component (D): Heat Conductive Filler
   D-1: Aluminum powder of average particle diameter 7.4 μm
      D-2: Alumina powder of average particle diameter 5.3 μm
      D-3: Zinc oxide powder of average particle diameter 1.0 μm Component (E): Workability Improvement Agent
   E-1: $C_{10}H_{21}Si(OCH_3)_3$ <Preparation of Compositions for Heat Softening, Heat Conductive Layers>

Using a 5 L gate mixer (a 5 liter planetary mixer, manufactured by Inoue Manufacturing Co., Ltd.), each of the components were combined in the ratios shown in Table 1, and mixed for 1 hour at 120° C., yielding the targeted compositions K-1 (for comparison), K-2 and K-3.

<Components of Heat Conductive Silicone Rubber Layers>

Component (A): Polyorganosiloxane Containing Alkenyl Groups
   A-1: Polydimethylsiloxane with both molecular chain terminals blocked with dimethylvinylsiloxy groups, and with a viscosity at 25° C. of 600 mPa·s Component (B): Polyorganohydrogensiloxane Containing Hydrogen Atoms Bonded to Silicon Atoms
   B-1: The polymethylhydrogensiloxane represented by the formula shown below.

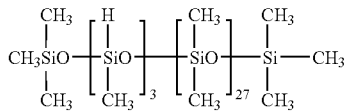

Component (C): Platinum Based Catalyst
   C-1: Toluene solution of platinum-divinyltetramethyldisiloxane complex (concentration: 1% by weight of platinum metal)

Component (D): Heat Conductive Filler
   D-1: Aluminum powder of average particle diameter 7.4 μm
      D-2: Alumina powder of average particle diameter 5.3 μm
      D-3: Zinc oxide powder of average particle diameter 1.0 μm Component (E): Workability Improvement Agent
   E-1: $C_{10}H_{21}Si(OCH_3)_3$ Component (J): Catalytic Activity Control Agent
   J-1: A 50% by weight toluene solution of 1-ethynyl-1-cyclohexanol <Preparation of Heat Conductive Silicone Rubber Layers>

Using a 5 L gate mixer (a 5 liter planetary mixer, manufactured by Inoue Manufacturing Co., Ltd.), the components other than the component (B), the component (C) and the component (J) were combined in the ratios shown in Table 1, and mixed for 1 hour at 120° C. After cooling to room temperature, the component (B), the component (C) and the component (J) were added and mixed for a further 30 minutes at room temperature, yielding the targeted compositions L-1 and L-2.

TABLE 1

| | Composition for layer (a) | | | Composition for rubber layer | |
| | K-1 | | | | |
| Component | (comparison) | K-2 | K-3 | L-1 | L-2 |
|---|---|---|---|---|---|
| A-1 | — | — | — | 87.6 | 87.6 |
| B-1 | — | — | — | 12.4 | 12.4 |
| C-1 | — | — | — | 1.24 | 1.24 |
| D-1 | — | 635 | — | 450 | — |
| D-2 | 1200 | — | 1150 | — | 525 |
| D-3 | — | 168 | 190 | 67.0 | 77.0 |
| E-1 | — | 5.5 | 8.0 | 3.7 | 4.2 |
| F-1 | — | 100 | 100 | — | — |
| G-1 | 28.6 | — | — | — | — |
| G-2 | 71.4 | — | — | — | — |
| H-1 | 14.0 | — | — | — | — |
| I-1 | 28.0 | — | — | — | — |
| J-1 | — | — | — | 3.72 | 3.72 |

Examples 1 to 8, Comparative Examples 1 to 6

Using the combinations of heat softening, heat conductive layer compositions (K-1, K-2, K-3) and heat conductive silicone rubber layer compositions (L-1, L-2) shown in Table 2 and Table 3, heat conductive composite sheets were prepared using the heat conductive composite sheet production process [(1) to (7)] shown in Table 2 and Table 3.

The numbers (1) to (7) for the production process refer to each of the methods described above, as follows: (1) die molding method-1, (2) die molding method-2, (3) injection molding method-1, (4) injection molding method-2, (5) coating molding method-1, (6) coating molding method-2, and (7) thermocompression molding method.

[Evaluation Methods]

Each of the prepared heat conductive composite sheets was tested and evaluated for the following characteristics. The results of these evaluations are shown in Table 2 and Table 3.

<Thickness, Thermal Resistance>

Each of the heat conductive composite sheets (following removal of the polymer film that had undergone mold release treatment) was sandwiched between two standard aluminum plates to prepare a sample for measuring the thermal resistance. The thickness of each sample was measured using a micrometer (model number M820-25VA, manufactured by Mitutoyo Corporation), and the actual thickness of each heat conductive composite sheet was determined by subtracting the known thickness of the standard aluminum plates.

In addition, the thermal resistance (units: ° C.-cm$^2$/w) of the heat conductive composite sheet of each sample was measured using a thermal resistance measuring device (Microflash, manufactured by Holometrix Co., Ltd.).

<Reworkability>

Following the above thermal resistance test, each of the above samples was sandwiched in a double clip, (pressure: 196 kPa (2 kgf/cm$^2$)), and placed in an oven at 150° C. for 96 hours. The ease with which the heat conductive composite sheet could be peeled away from the aluminum plates was then measured, and evaluated as follows.

Evaluation A: Peeled off easily
Evaluation B: Difficult to peel off

<Heat Cycle Test>

A sample of each of the heat conductive composite sheets, that had been cut into a 25 mm square and had the polymer film that had undergone mold release treatment removed, was sandwiched between 2 transparent glass plates (of thickness 1 mm, and dimensions 50 mm×75 mm), and then clamped from both sides with a double clip (pressure: 196 kPa (2 kgf/cm$^2$)) to form a test sample. Each test sample was inserted into a −30° C. to 100° C. cycle tester, and following 500 cycles (1 cycle: 30 minutes), the sample was inspected visually for the occurrence of cracks, and evaluated as follows.

Evaluation A: Number of cracks: 0 to 5
Evaluation B: Number of cracks: 6 or greater <Interlayer Separation>

25 mm square samples of each of the heat conductive composite sheets were prepared, and for each sample the heat conductive silicone rubber layer (b) was held with the fingers, while the polymer film that had undergone mold release treatment was peeled away and removed from the layer (a) by hand. During this process, each sample was inspected for evidence of separation of the heat softening, heat conductive layer (a) and the heat conductive silicone rubber layer (b), and evaluated as follows.

Evaluation A: No interlayer separation observed (0%)
Evaluation B: A little interlayer separation occurs (1 to 10%)
Evaluation C: Prone to interlayer separation (11 to 100%)

Note: The number (7)' refers to a production process for a composite sheet based on the production process (7) described above, but using a composition (K-1) that utilizes a polyolefin as the matrix instead of a silicone resin.

[Evaluations]

The comparative example 1 and the comparative example 2 represent cases in which the matrix of the heat softening, heat conductive layer is a polyolefin. In the comparative example 1, which represents a composite sheet with a heat conductive silicone rubber layer (b), the thermal resistance is comparatively high, and the two layers are prone to separation at the interlayer interface. Furthermore, in the comparative example 2, which represents a single layer with no layer (b), the results of the reworkability evaluation and the heat cycle test were poor.

The comparative example 3 and the comparative example 4 represent sheets formed from a single layer (a), and in both cases the results of the reworkability evaluation and the heat cycle test were poor.

The comparative example 5 and the comparative example 6 represent sheets formed from a single layer (b), and although both sheets displayed good results for the reworkability evaluation and the heat cycle test, the thermal resistance values were high. This indicates that even if the layer contains a heat conductive filler, a layer (b) by itself displays poor adhesion to the aluminum plate, and a high level of interface thermal resistance.

The heat conductive composite sheets of the present invention displayed good thermal conductivity, while also offering excellent reworkability, and are ideally suited to use as a heat radiating structure provided between a heat generating electronic component and a heat radiating component such as a heat sink or a circuit board, for the purposes of radiating heat away from the heat generating electronic component and thus cooling it.

TABLE 2

| | Example No. | | | | | | | |
|---|---|---|---|---|---|---|---|---|
| | 1 | 2 | 3 | 4 | 5 | 6 | 7 | 8 |
| Composition for sheet (a) | K-2 | K-3 | K-2 | K-2 | K-2 | K-2 | K-2 | K-2 |
| Composition for rubber sheet | L-1 | L-2 | L-1 | L-1 | L-1 | L-1 | L-1 | L-1 |
| Production process for composite sheet | (7) | (7) | (1) | (2) | (3) | (4) | (5) | (6) |
| Thickness (μm) | 250 | 250 | 500 | 500 | 500 | 500 | 250 | 250 |
| Thermal resistance (° C.-cm$^2$/w) | 0.85 | 1.02 | 1.42 | 1.38 | 1.44 | 1.36 | 0.75 | 0.71 |
| Reworkability | A | A | A | A | A | A | A | A |
| Heat cycle test | A | A | A | A | A | A | A | A |
| Interlayer separation | B | B | A | A | A | A | A | A |

TABLE 3

| | Comparative Example No. | | | | | |
|---|---|---|---|---|---|---|
| | 1 | 2 | 3 | 4 | 5 | 6 |
| Composition for sheet (a) | K-1 | K-1 | K-2 | K-3 | — | — |
| Composition for rubber sheet | L-2 | — | — | — | L-1 | L-2 |
| Production process for composite sheet | (7)' | — | — | — | — | — |
| Thickness (μm) | 250 | 250 | 250 | 250 | 250 | 250 |
| Thermal resistance (° C.-cm$^2$/w) | 1.52 | 1.20 | 0.64 | 1.02 | 1.85 | 2.45 |
| Reworkability | A | B | B | B | A | A |
| Heat cycle test | A | B | B | B | A | A |
| Interlayer separation | C | — | — | — | — | — |

What is claimed is:

1. A heat conductive composite sheet comprising:
   (a) a heat softening, heat conductive layer comprising a silicone resin and a heat conductive filler, wherein said silicone resin is at least one selected from the group consisting of:
   $D^1{}_m T_p D^2{}_n$
   wherein
   $D^1$ represents a $(CH_3)_2SiO$ unit,
   T represents a $(C_6H_5)SiO_{3/2}$ unit,
   $D^2$ represents a $(CH_3)(CH_2\!\!=\!\!CH)SiO$ unit,
   the molar ratio (m+n)/p is within a range from 0.25 to 4.0, and
   the molar ratio (m+n)/m is within a range from 1.0 to 4.0;

$M_l D^1_m T_p D^2_n$
wherein
M represents a $(CH_3)_3SiO_{1/2}$ unit,
$D^1$ represents a $(CH_3)_2SiO$ unit,
T represents a $(C_6H_5)SiO_{3/2}$ unit,
$D^2$ represents a $(CH_3)(CH_2=CH)SiO$ unit,
the molar ratio (m+n)/p is within a range from 0.25 to 4.0,
the molar ratio (m+n)/m is within a range from 1.0 to 4.0, and
the molar ratio 1/(m+n) is within a range from 0.001 to 0.1; and
$M_l D^1_m Q_q D^2_n$
wherein
M represents a $(CH_3)_3SiO_{1/2}$ unit,
$D^1$ represents a $(CH_3)_2SiO$ unit,
Q represents $SiO_{4/2}$,
$D^2$ represents a $(CH_3)(CH_2=CH)SiO$ unit,
the molar ratio (m+n)/q is within a range from 0.25 to 4.0,
the molar ratio (m+n)/m is within a range from 1.0 to 4.0, and
the molar ratio 1/(m+n) is within a range from 0.001 to 0.1,
(b) a heat conductive silicone rubber layer comprising a heat conductive filler;
wherein at least the surface of the layer (a) opposite to the layer (b) is capable of melting at a temperature that ranges from 40° C. to 100° C.

2. The heat conductive composite sheet according to claim 1, wherein said heat conductive silicone rubber of said layer (b) comprises a cured product of an addition reaction curable silicone rubber composition comprising a heat conductive filler.

3. The heat conductive composite sheet according to claim 1, wherein said heat conductive silicone rubber of said layer (b) comprises a cured product of a condensation curable silicone rubber composition comprising a heat conductive filler.

4. The heat conductive composite sheet according to claim 1, wherein said heat conductive silicone rubber of said layer (b) is a cured product of a radical reaction curable silicone rubber composition comprising a heat conductive filler.

5. The heat conductive composite sheet according to claim 1, wherein at least the surface of the heat softening, heat conductive layer is capable of melting at a temperature that ranges from 40° C. to 90° C.

6. A process for producing a heat conductive composite sheet comprising:
(a) a heat softening, heat conductive layer formed of a composition comprising a silicone resin and a heat conductive filler, wherein said silicone resin is at least one selected from the group consisting of:
$D^1_m T_p D^2_n$
wherein
$D^1$ represents a $(CH_3)_2SiO$ unit,
T represents a $(C_6H_5)SiO_{3/2}$ unit,
$D^2$ represents a $(CH_3)(CH_2=CH)SiO$ unit,
the molar ratio (m+n)/p is within a range from 0.25 to 4.0, and
the molar ratio (m+n)/m is within a range from 1.0 to 4.0;
$M_l D^1_m T_p D^2_n$
wherein
M represents a $(CH_3)_3SiO_{1/2}$ unit,
$D^1$ represents a $(CH_3)_2SiO$ unit,
T represents a $(C_6H_5)SiO_{3/2}$ unit,
$D^2$ represents a $(CH_3)(CH_2=CH)SiO$ unit,
the molar ratio (m+n)/p is within a range from 0.25 to 4.0,
the molar ratio (m+n)/m is within a range from 1.0 to 4.0, and
the molar ratio 1(m+n) is within a range from 0.001 to 0.1; and
$M_l D^1_m Q_q D^2_n$
wherein
M represents a $(CH_3)_3SiO_{1/2}$ unit,
$D^1$ represents a $(CH_3)_2SiO$ unit,
Q represents $SiO_{4/2}$,
$D^2$ represents a $(CH_3)(CH_2=CH)SiO$ unit,
the molar ratio (m+n)/q is within a range from 0.25 to 4.0,
the molar ratio (m+n)/m is within a range from 1.0 to 4.0, and
the molar ratio 1/(m+n) is within a range from 0.001 to 0.1, and
(b) a heat conductive silicone rubber layer comprising a heat conductive filler, said process comprising:
providing said heat conductive silicone rubber layer of (b),
optionally forming at least one intermediate layer on top of said heat conductive silicone rubber layer of (b), and
forming a layer of said composition on top of said heat conductive silicone rubber layer of (b) or, if said intermediate layer is present, on top of the intermediate layer;
wherein at least the surface of the layer (a) opposite to the layer (b) is capable of melting at a temperature that ranges from 40° C. to 100° C.

7. A process for producing a heat conductive composite sheet comprising:
(a) a heat softening, heat conductive layer comprising a silicone resin and a heat conductive filler, wherein said silicone resin is at least one selected from the group consisting of:
$D^1_m T_p D^2_n$
wherein
$D^1$ represents a $(CH_3)_2SiO$ unit,
T represents a $(C_6H_5)SiO_{3/2}$ unit,
$D^2$ represents a $(CH_3)(CH_2=CH)SiO$ unit,
the molar ratio (m+n)/p is within a range from 0.25 to 4.0, and
the molar ratio (m+n)/m is within a range from 1.0 to 4.0;
$M_l D^1_m T_p D^2_n$
wherein
M represents a $(CH_3)_3SiO_{1/2}$ unit,
$D^1$ represents a $(CH_3)_2SiO$ unit,
T represents a $(C_6H_5)SiO_{3/2}$ unit,
$D^2$ represents a $(CH_3)(CH_2=CH)SiO$ unit,
the molar ratio (m+n)/p is within a range from 0.25 to 4.0,
the molar ratio (m+n)/m is within a range from 1.0 to 4.0, and
the molar ratio 1(m+n) is within a range from 0.001 to 0.1; and
$M_l D^1_m Q_q D^2_n$
wherein
M represents a $(CH_3)_3SiO_{1/2}$ unit,
$D^1$ represents a $(CH_3)_2SiO$ unit,
Q represents $SiO_{4/2}$,
$D^2$ represents a $(CH_3)(CH_2=CH)SiO$ unit, the molar ratio (m+n)/q is within a range from 0.25 to 4.0, the molar ratio (m+n)/m is within a range from 1.0 to 4.0, and the molar ratio 1(m+n) is within a range from 0.001 to 0.1, and (b) a heat conductive silicone rubber layer comprising a heat conductive filler, said process comprising:

providing said heat softening, heat conductive layer comprising a silicone resin and a heat conductive filler of(a), forming a layer of a liquid, curable silicone rubber composition comprising a heat conductive filler on top of said heat softening, heat conductive layer of (a), and curing said composition to form said heat conductive silicone rubber layer of(b);

wherein at least the surface of the layer (a) opposite to the layer (b) is capable of melting at a temperature that ranges from 40° C. to 100° C.

8. The process according to claim 7, wherein said liquid, curable silicone rubber composition is an addition reaction curable silicone rubber composition.

9. The process according to claim 7, wherein said liquid, curable silicone rubber composition is a condensation curable silicone rubber composition.

10. A process for producing a heat conductive composite sheet comprising:

(a) a heat softening, heat conductive layer comprising a silicone resin and a heat conductive filler, wherein said silicone resin is at least one selected from the group consisting of:

$D^1_m T_p D^2_n$ wherein $D^1$ represents a $(CH_3)_2SiO$ unit,

T represents a $(C_6H_5)SiO_{3/2}$ unit, $D^2$ represents a $(CH_3)(CH_2=CH)SiO$ unit, the molar ratio (m+n)/p is within a range from 0.25 to 4.0, and the molar ratio (m+n)/m is within a range from 1.0 to 4.0;

$M_l D^1_m T_p D^2_n$ wherein

M represents a $(CH_3)_3SiO_{1/2}$ unit, $D^1$ represents a $(CH_3)_2SiO$ unit,

T represents a $(C_6H_5)SiO_{3/2}$ unit, $D^2$ represents a $(CH_3)(CH_2=CH)SiO$ unit, the molar ratio (m+n)/p is within a range from 0.25 to 4.0, the molar ratio (m+n)/m is within a range from 1.0 to 4.0, and the molar ratio 1(m+n) is within a range from 0.001 to 0.1; and $M_l D^1_m Q_q D^2_n$ wherein M represents a $(CH_3)_3SiO_{1/2}$ unit, $D^1$ represents a $(CH_3)_2SiO$ unit, Q represents $SiO_{4/2}$, $D^2$ represents a $(CH_3)(CH_2=CH)SiO$ unit, the molar ratio (m+n)/q is within a range from 0.25 to 4.0, the molar ratio (m+n)/m is within a range from 1.0 to 4.0, and the molar ratio 1(m+n) is within a range from 0.001 to 0.1, and (b) a heat conductive silicone rubber layer comprising a heat conductive filler, said process comprising:

subjecting a heat softening, heat conductive sheet comprising a silicone resin and a heat conductive filler, and a heat conductive silicone rubber sheet comprising a heat conductive filler to thermocompression bonding together;

wherein at least the surface of the layer (a) opposite to the layer (b) is capable of melting at a temperature that ranges from 40° C. to 100° C.

11. A heat conductive composite sheet comprising:

(a) a heat softening, heat conductive layer comprising a silicone resin and a heat conductive filler, wherein said silicone resin comprises a polymer comprising a silicone resin cnotaining $RSiO_{3/2}$ units, but containing no $R_2SiO$ units, and an polydiorganopoplysiloxane with a viscosity at 25° C. of at least 100 Pa·s comprised of $R_2SiO$ units and terminal $R_3SiO_{1/2}$ units wherein in the formulas R each represent an unsubstituted or substituted hydrocarbon group of 1 to 10 carbon atoms, and (b) a heat conductive silicone rubber layer comprising a heat conductive filler;

wherein at least the surface of the layer (a) opposite to the layer (b) is capable of melting at a temperature that ranges from 40° C. to 100° C.

12. The heat conductive composite sheet according to claim 11, wherein said heat conductive silicone rubber of said layer (b) comprises a cured product of an addition reaction curable silicone rubber composition comprising a heat conductive filler.

13. The heat conductive composite sheet according to claim 11, wherein said heat conductive silicone rubber of said layer (b) comprises a cured product of a condensation curable silicone rubber composition comprising a heat conductive filler.

14. The heat conductive composite sheet according to claim 11, wherein said heat conductive silicone rubber of said layer (b) is a cured product of a radical reaction curable silicone rubber composition comprising a heat conductive filler.

15. The heat conductive composite sheet according to claim 11, wherein at least the surface of the heat softening, heat conductive layer is capable of melting at a temperature that ranges from 40° C. to 90° C.

16. A process for producing a heat conductive composite sheet comprising:

(a) a heat softening, heat conductive layer formed of a composition comprising a silicone resin and a heat conductive filler, wherein said silicone resin comprises a polymer comprising a silicone resin cnotaining $RSiO_{3/2}$ units, but containing no $R_2SiO$ units, and an polydiorganopoplysiloxane with a viscosity at 25° C. of at least 100 Pa·s comprised of $R_2SiO$ units and terminal $R_3SiO_{1/2}$ units wherein in the formulas R each represent an unsubstituted or substituted hydrocarbon group of 1 to 10 carbon atoms, and (b) a heat conductive silicone rubber layer comprising a heat conductive filler, said process comprising:

providing said heat conductive silicone rubber layer of (b), optionally forming at least one intermediate layer on top of said heat conductive silicone rubber layer of (b), and forming a layer of said composition on top of said heat conductive silicone rubber layer of (b) or, if said intermediate layer is present, on top of the intermediate layer;

wherein at least the surface of the layer (a) opposite to the layer (b) is capable of melting at a temperature that ranges from 40° C. to 100° C.

17. A process for producing a heat conductive composite sheet comprising:
- (a) a heat softening, heat conductive layer comprising a silicone resin and a heat conductive filler, wherein said silicone resin comprises a polymer comprising a silicone resin cnotaining $RSiO_{3/2}$ units, but containing no $R_2SiO$ units, and an polydiorganopoplysiloxane with a viscosity at 25° C. of at least 100 Pa·s comprised of $R_2SiO$ units and terminal $R_3SiO_{1/2}$ units wherein in the formulas R each represent an unsubstituted or substituted hydrocarbon group of 1 to 10 carbon atoms, and
- (b) a heat conductive silicone rubber layer comprising a heat conductive filler, said process comprising:

providing said heat softening, heat conductive layer comprising a silicone resin and a heat conductive filler of (a), forming a layer of a liquid, curable silicone rubber composition comprising a heat conductive filler on top of said heat softening, heat conductive layer of (a), and curing said composition to form said heat conductive silicone rubber layer of(b);

wherein at least the surface of the layer (a) opposite to the layer (b) is capable of melting at a temperature that ranges from 40° C. to 100° C.

18. The process according to claim 17, wherein said liquid, curable silicone rubber composition is an addition reaction curable silicone rubber composition.

19. The process according to claim 17, wherein said liquid, curable silicone rubber composition is a condensation curable silicone rubber composition.

20. A process for producing a heat conductive composite sheet comprising:
- (a) a heat softening, heat conductive layer comprising a silicone resin and a heat conductive filler, wherein said silicone resin comprises a polymer comprising a silicone resin cnotaining $RSiO_{3/2}$ units, but containing no $R_2SiO$ units, and an polydiorganopoplysiloxane with a viscosity at 25° C. of at least 100 Pa·s comprised of $R_2SiO$ units and terminal $R_3SiO_{1/2}$ units wherein in the formulas R each represent an unsubstituted or substituted hydrocarbon group of 1 to 10 carbon atoms, and
- (b) a heat conductive silicone rubber layer comprising a heat conductive filler, said process comprising:

subjecting a heat softening, heat conductive sheet comprising a silicone resin and a heat conductive filler, and a heat conductive silicone rubber sheet comprising a heat conductive filler to thermocompression bonding together;

wherein at least the surface of the layer (a) opposite to the layer (b) is capable of melting at a temperature that ranges from 40° C. to 100° C.

* * * * *